(12) United States Patent
Anderson (10) Patent No.: US 6,282,218 B1
(45) Date of Patent: *Aug. 28, 2001

(54) CONTROL CIRCUIT WITH AUTOMATIC DC OFFSET

(75) Inventor: Stuart L. Anderson, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/241,319

(22) Filed: Feb. 1, 1999

Related U.S. Application Data (63) Continuation of application No. 08/780,865, filed on Jan. 9, 1997, now Pat. No. 5,867,514.

(51) Int. Cl.[7] .............................. H01S 3/00; H01S 3/13
(52) U.S. Cl. .................................. 372/38.02; 372/38.07; 372/32; 372/33
(58) Field of Search .................... 372/38.02, 38.07, 372/32, 33

(56) References Cited

U.S. PATENT DOCUMENTS 5,867,514 * 2/1999 Anderson .............................. 372/38

* cited by examiner

Primary Examiner—Frank G. Font
Assistant Examiner—Armando Rodriguez
(74) Attorney, Agent, or Firm—Brian Ogonowsky, Esq.

(57) ABSTRACT

An automatic gain control circuit in the feedback path for a laser wavelength control circuit is described herein. This gain control circuit automatically adjusts the amplification of the analog signals output from a photodetector array, where the array detects a fringe pattern created by a laser beam. Another feature of the preferred embodiment feedback circuit is the automatic setting of a DC offset voltage that compensates for errors in the feedback path and enables an accurate determination of a dark level signal in the fringe pattern signal. This dark level signal provides a reference for measuring the magnitude of the fringe pattern signal. Varying photodetector outputs may now be more accurately measured. The preferred embodiment feedback circuit also employs a very fast amplifier anti-saturation circuit using LED's connected in a clamp circuit.

12 Claims, 6 Drawing Sheets

CONTROL CIRCUIT WITH AUTOMATIC DC OFFSET

CROSS-REFERENCE TO RELATED APPLICATION

This is a continuation of U.S. application Ser. No. 08/780,865, filed Jan. 9, 1997, now U. S. Pat. No. 5,867,514, entitled Laser Wavelength Control Circuit Having Automatic DC Offset And Gain Adjustment by Stuart L. Anderson.

FIELD OF THE INVENTION

This invention relates to laser control circuits and, in particular, to control circuits for controlling the laser wavelength.

BACKGROUND

Lasers are used for many applications. In one example, lasers are used in steppers for selectively exposing photoresist in a semiconductor wafer fabrication process. In such fabrication processes, the optics in the stepper are designed for a particular wavelength of the laser. The laser wavelength may drift over time and, thus, some means is typically employed to detect the wavelength of the laser and correct the wavelength as necessary.

In one type of feedback network used to detect and adjust the wavelength of a laser, an etalon receives a portion of the emitted light from the laser. The etalon creates an interference pattern having concentric bands of dark and light levels due to destructive and constructive interference by the laser light. The concentric bands surround a center bright portion. The position of the bright center portion of the interference pattern is used to determine wavelength to a relatively coarse degree, such as to within 5 picometers (pm). The diameter of a light band is used to determine the wavelength of the laser to a fine degree, such as to within 0.01–0.03 pm. The width of a light band is used to determine the spectral width of the laser output. The interference pattern is usually referred to as a fringe pattern.

In order to measure the light levels in the fringe pattern, the fringe pattern must be optically detected by a sensitive photodetector array and the resulting signal amplified. This signal usually contains errors due to manufacturing and temperature related variances in the components forming the feedback system. The amplified signal is then applied to an analog-to-digital (A/D) converter. Since the analog signals applied to the A/D converter have a relatively large dynamic range, the A/D converter must also have a large range, such as at least 12 bits of quantization, in order to adequately resolve small signals as well as large signals. Such a wide-range A/D converter and the processing circuits required to process this wide range are relatively expensive.

What is needed is a technique to lower the cost of the feedback path in such a laser control system without losing accuracy in the measurement of the wavelength.

SUMMARY

An automatic gain control circuit in the feedback path for a laser wavelength control circuit is described herein. This gain control circuit automatically adjusts the amplification of the analog signals output from a photodetector array, where the array detects a fringe pattern created by a laser beam.

A microprocessor, or other suitable circuit, in he feedback path determines a peak level of the fringe pattern signal and sets the gain of the amplifier so that the amplified peak signal, when converted by a downstream A/D converter, always results in a digital signal within a specified upper output range of the A/D converter. Thus, the A/D converter can have a much smaller dynamic range (e.g., 8 bits) than A/D converters (e.g., 12 bits) used in feedback paths having fixed gains. In the preferred embodiment, the automatic gain adjustment reduces the dynamic range of the analog signals to one-twentieth of the unadjusted signals, allowing the A/D converter range to be reduced by 4 bits. By only requiring a 1-byte A/D converter, downstream processing circuits can also be reduced in size.

Another feature of the preferred embodiment feedback circuit is the automatic setting of a DC offset voltage that compensates for errors in the feedback path and enables an accurate determination of a dark level signal in the fringe pattern signal. This dark level signal provides a reference for measuring the magnitude of the fringe pattern signal. Very small photodetector outputs may now be accurately measured. Errors corrected by this DC offset voltage may be due to manufacturing variances in the components as well as due to performance variations of the photodetector array and other components with temperature.

A microprocessor detects the minimum output by the A/D converter, assumes these minimum signals are dark level signals, and adjusts the DC offset voltage for an upstream amplifier as necessary to ensure the dark level signals output by the A/D converter are a predetermined value.

The preferred embodiment feedback circuit also employs a novel amplifier anti-saturation circuit. The center portion of the circular fringe pattern is very bright compared with the surrounding fringe pattern. As the photodetector array is scanned to read the center portion of the fringe pattern, the high magnitude signal may saturate the sensitive amplifier amplifying the photodetector array signals. Such saturation distorts the falling edge of the center signal in the fringe pattern, creating an erroneous reading of the position of the center portion. This creates error in the determination of the wavelength.

The distortion can also affect the determination of a dark level reference signal. The preferred embodiment of the feedback circuit incorporates an extremely fast anti-saturation circuit for the amplifier. Anti-saturation circuits are known which use conventional diodes or zener diodes. Applicant has discovered that unexpected results are obtained by using light emitting diodes (LED's) as the anti-saturation diodes. Using these LED's results in a faster clamping reaction time for the amplifier to prevent the amplifier from going into saturation. This faster reaction time allows the photodetector array to be scanned at higher speeds.

DETAILED DESCRIPTION OF THE PREFERRED EMBODIMENTS

Figure 1A:
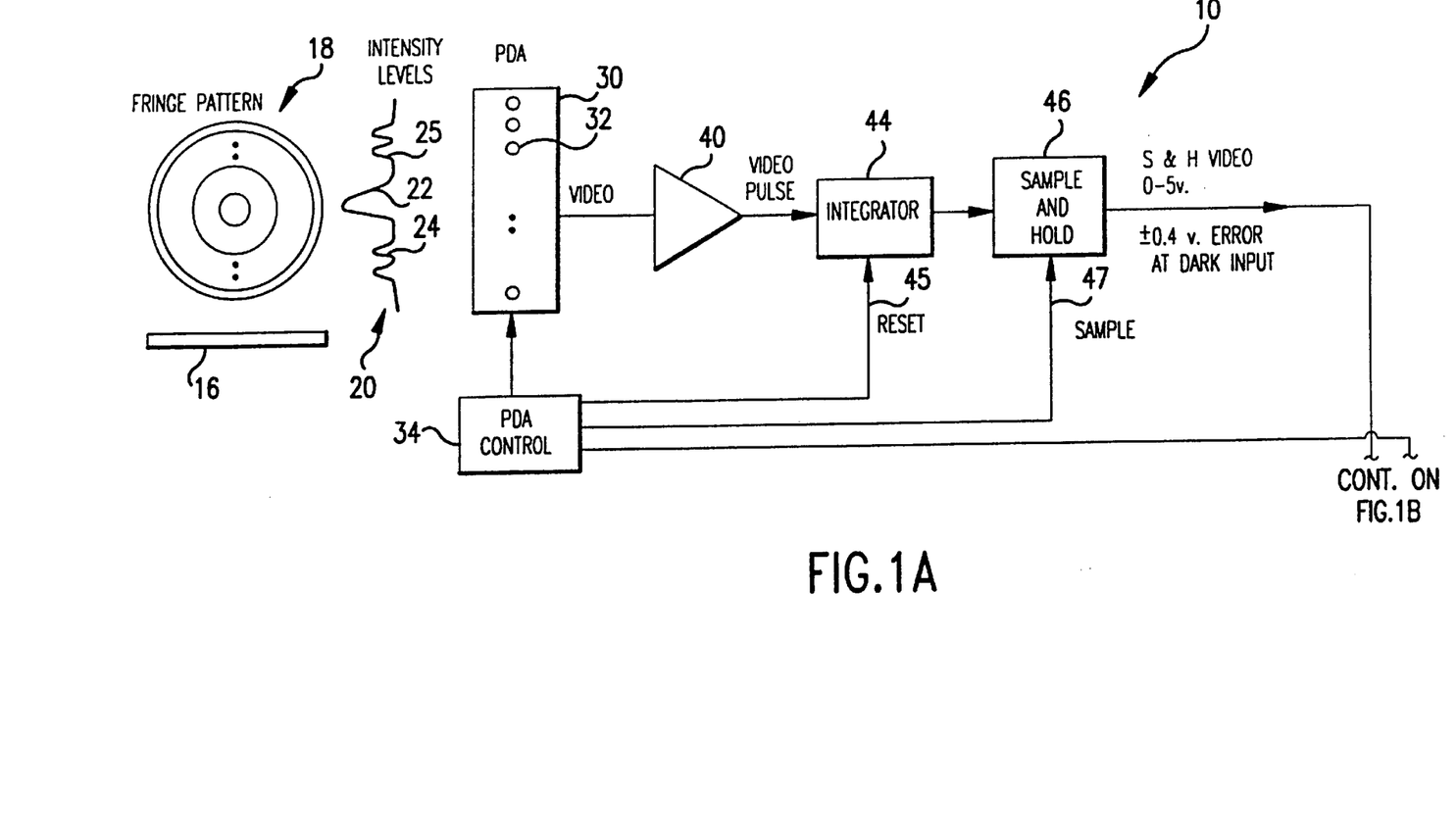
FIGS. 1A, 1B illustrates the preferred embodiment feedback circuit used for controlling the wavelength of a laser.
Figure 1B:
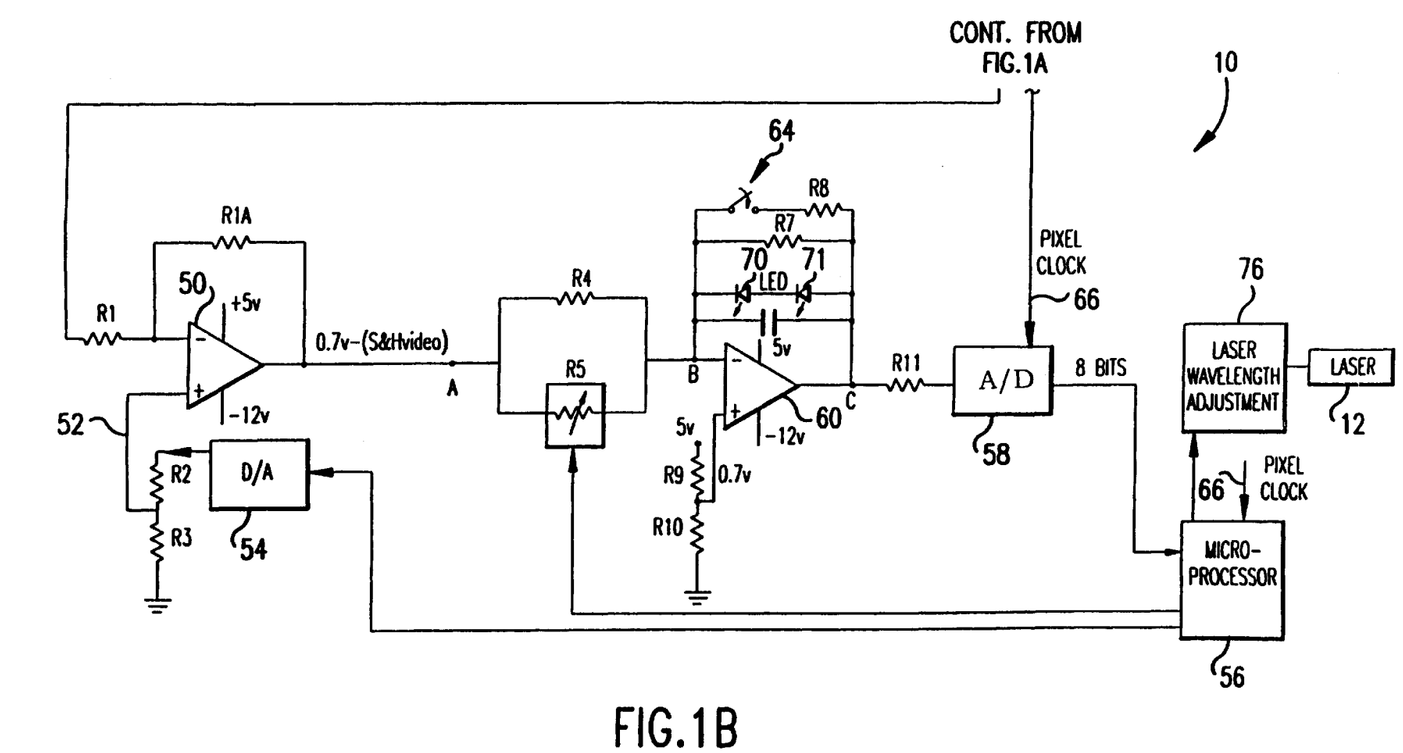

FIG. 1 illustrates the preferred embodiment of a feedback system 10 for a tunable laser 12 to adjust the wavelength of laser 12. The feedback system 10 may also be used to detect the spectral width of the laser beam. Laser 12, in one embodiment, is an ultraviolet excimer laser which emits pulses of laser energy.

Figure 2:
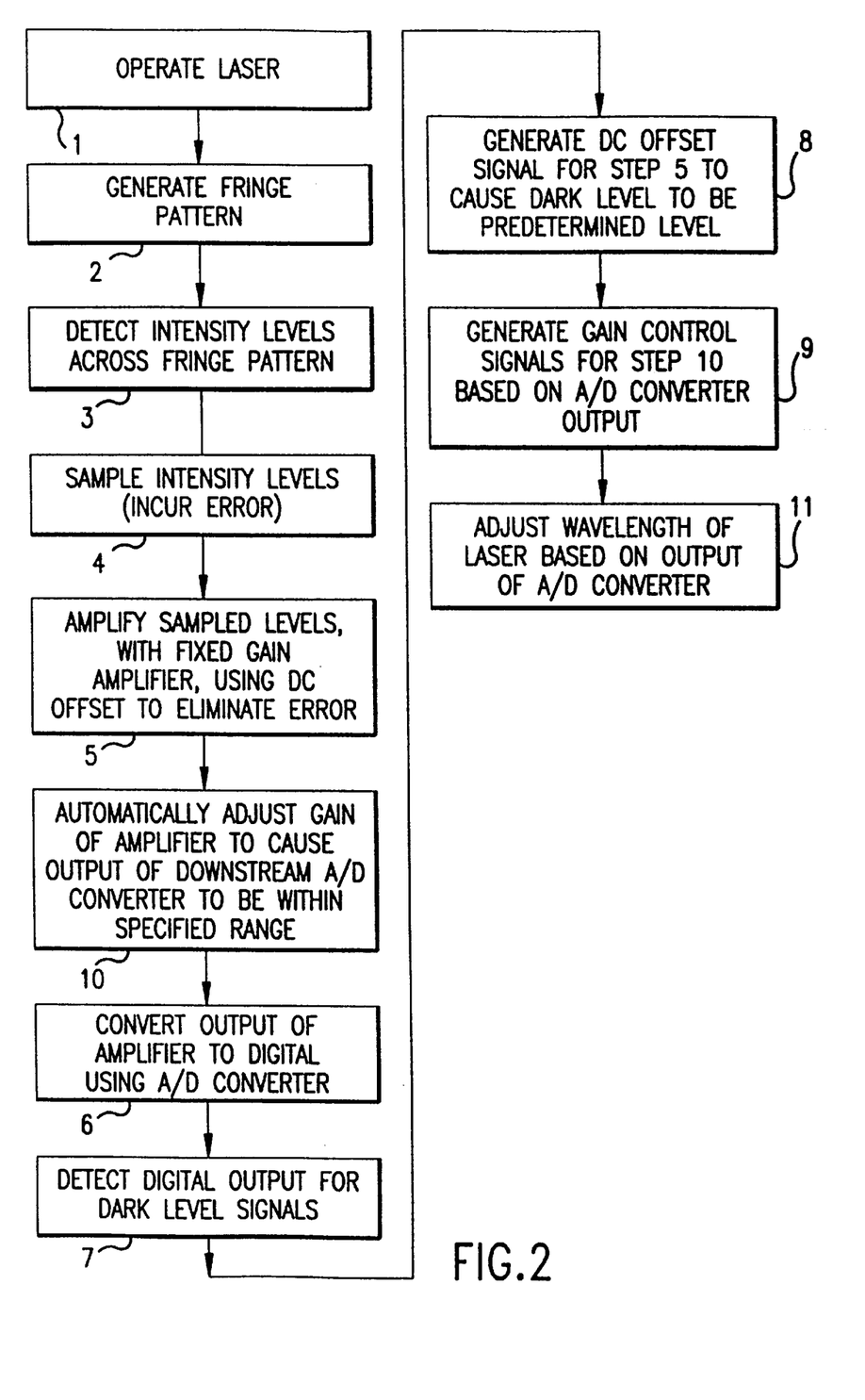
FIG. 2 is a flowchart of the pertinent process carried out by the feedback circuit of FIG. 1.

The steps in the flowchart of FIG. 2 will be identified as they apply to a description of the operation of the system of FIG. 1.

As laser 12 is being operated (step 1) in an application, such as in a stepper for wafer fabrication, a portion of its emitted light is directed to an etalon 16, or slits, or other conventional device which produces a fringe pattern 18 or other light pattern having light and dark areas (step 2). Further details regarding a suitable laser and optical elements for impinging laser light upon an etalon, and other background materials, may be found in the following patents assigned to the present assignee and incorporated herein by reference: U.S. Pat. No. 5,025,445, entitled System For, and Method of, Regulating the Wavelength of a Light Beam, by Stuart Anderson et al.; U.S. Pat. No. 5,420,877, entitled Temperature Compensation Method and Apparatus for Wave Meters and Tunable Lasers Controlled Thereby, by Richard Sandstrom et al.; U.S. Pat. No. 5,095,492, entitled Spectral Narrowing Technique, by Richard Sandstrom; and U.S. Pat. No. 5,450,207, entitled Method and Apparatus for Calibrating a Laser Wavelength Control Mechanism, by Igor Formenkov.

The laser light impinging on the etalon 16 generates a fringe pattern 18 whose light intensities (and corresponding electrical signals generated) across a bisection of the fringe pattern 18 are shown by graph 20 in FIG. 1. Graph 20 shows a center signal 22 and a number of concentric fringe signals, such as signals 24 and 25, generally symmetrical around the center of the fringe pattern 18. The diameters of the concentric fringe signals correspond to the wavelength of the light output from laser 12. The widths of each of the fringe signals correspond to the spectral width of the laser light at a particular wavelength. The magnitudes of the fringe signals correspond to the energy in the laser pulse.

The feedback system 10 accurately converts the light levels in the fringe pattern 18 into digital signals for use by additional processing circuitry, such as described in the above-mentioned patents, to control the wavelength of the tunable laser 12 and to detect various other characteristics of the laser beam. Laser 12 may be tuned mechanically, optically, or chemically (e.g., by controlling the mixture of gases in laser 12), and the precise method used to tune the laser once an accurate wavelength detection is made is not relevant to this invention. Further details regarding the creation of the fringe pattern is described in U.S. Pat. No. 5,025,445, previously mentioned.

A photodetector array (PDA) 30 detects (step 3) the light intensity levels across fringe pattern 18 and converts the light intensity levels into analog signals. Suitable PDA's are well known and commercially available. In one embodiment, PDA 30 is a linear array of 1024 photodiodes 32 formed on a single integrated circuit, where the photodiode spacing is 25 microns. Any suitable photodetector device may be used.

A PDA control circuit 34 may be conventional and provides clock signals and other control signals to the PDA 30 and other devices. Its construction may be obtained from application literature provided from the manufacturer of the PDA. The PDA control circuit 34 scans each of the photodiodes 32 at a clock frequency of about 2 MHz, allowing the full 1024 array to be read in approximately 512 microseconds.

Laser 12 is typically a pulse-type laser which emits pulses of laser energy. In one embodiment, laser 12 emits pulses at 1000 pulses per second or greater. Ideally, the PDA 30 is fully scanned, and its output evaluated for wavelength accuracy, for each pulse of laser 12.

As each photodiode 32 output is scanned, an analog signal corresponding to the light level impinging upon that photodiode 32 is applied to an input terminal of amplifier 40.

The analog output of amplifier 40 for each photodiode signal is then integrated over a short period by integrator 44. Prior to a next photodiode 32 being accessed, integrator 44 is reset by a signal on line 45 from the PDA control circuit 34.

At a particular time during the period of integration, the analog signal output by integrator 44 is sampled (step 4) and held by a sample and hold circuit 46. The PDA control circuit 34 generates a sample pulse on line 47 shortly before the reset pulse to integrator 44 is generated. The analog output of the sample and hold circuit 46 ranges between 0 and 5 volts in the preferred embodiment, and the sampling rate is at a frequency of approximately 2 MHz.

Although the components used to build the circuitry just described are manufactured within a small tolerance (e.g., 1%), accumulated tolerances and temperature related changes cause the dark level output of the sample and hold circuit 46 to have an error of about±0.4 volts. In other words, although the fringe pattern dark level reference voltage should ideally be 0 volts, in actuality this dark level is only known to ±0.4 volts. This is a significant error, since fringe signals having amplitudes less than 0.4 volts may not even be detected. The PDA 30 is also affected by temperature variations, and this also contributes to the error at the output of the sample and hold circuit 46 for a dark PDA input.

The following describes how the feedback system 10 automatically generates a DC offset for offsetting the ±0.4 volt error output from the sample and hold circuit 46 and automatically sets the gain of the subsequent amplifier stages to better enable the fringe pattern to be accurately measured for adjusting the wavelength of laser 12.

The output of the sample and hold circuit 46 is applied to an inverting input of a unity gain operational amplifier 50 (step 5). Identical resistors R1 and R1A cause amplifier 50 to have a unity gain. A variable DC offset signal on line 52 is applied to the non-inverting input of amplifier 50. The DC offset signal is set by the output of a digital-to-analog (D/A) converter 54, whose digital input is provided by a microprocessor 56. The analog output of the D/A converter 54 is divided by resistors R2 and R3, which in the preferred embodiment are 3.57K ohms and 1.4K ohms, respectively. The DC offset is controlled so that the output of amplifier 50 is always 0.7 volts minus an error-free output of the sample and hold circuit 46, with the ±0.4 volt error eliminated as described below. Thus, a dark level input into PDA 30 corresponds to 0.7 volts at the output of amplifier 50. Accordingly, the output of amplifier 50 contains essentially no error.

The variable output of the D/A converter 54 is under the control of a feedback circuit incorporating microprocessor 56. Microprocessor 56 is connected to an output of an A/D converter 58 (step 6), which provides a digital, amplified representation of the light intensity level impinging on an accessed photodiode 32 in the PDA 30. Microprocessor 56 determines the minimum signal levels (i.e., the dark levels) on opposite sides of the center signal 22 of the fringe pattern 18 (step 7). This may be performed in a number of ways. One way is by comparing successive signals and selecting those signals which have the lowest value. However, in the preferred embodiment, the feedback system 10 detects the signals from preselected photodiodes 32 known to receive a dark level.

In a typical arrangement, there is a relatively large gap between the edge of the center bright portion and the surrounding fringe portion. Therefore, a large number of photodiodes 32 on both sides of the center bright portion do not receive any light. Typically, the width of the center signal 22 corresponds to about 20–50 of the photodiodes 32 near the middle of the PDA 30. The remainder of the fringe pattern is detected by the last quarter of the PDA 30 at both ends of the PDA 30. The width of each fringe signal corresponds to about 3–4photodiodes 32. To obtain a reliable dark signal level, the digital signals associated with two predetermined adjacent photodiodes likely receiving a dark input on one side of the center signal 22 are averaged together. The signals from two predetermined adjacent photodiodes likely receiving a dark input on the other side of the center signal 22 are also averaged together. Since the center bright portion takes up such a small area in the middle section of the PDA 30, at least one of the two groups of photodiodes will receive a dark input. The averaged signal that is the lowest is then used to represent the dark level reference signal. The signals from two photodiodes are averaged to compensate for variances between photodiodes. Other methods of detecting a dark level may be performed instead.

Figure 3:
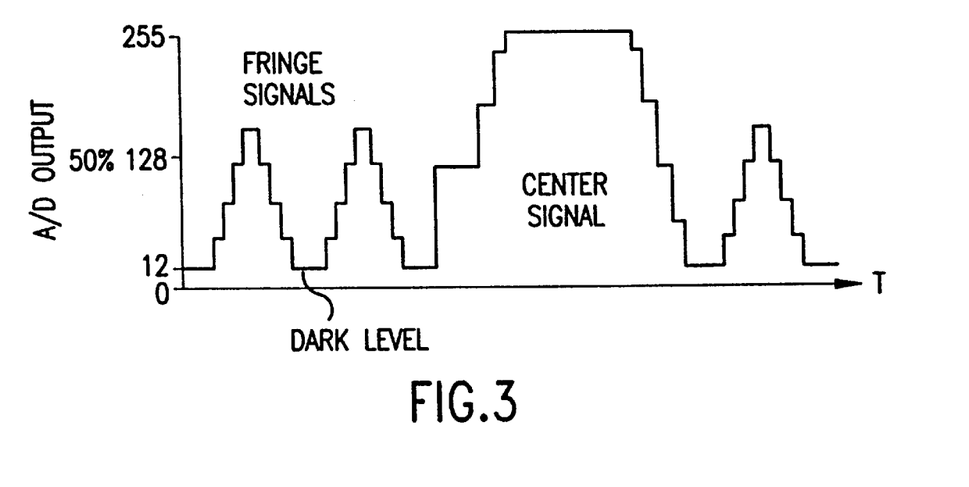
FIG. 3 illustrates an output of an A/D converter, whose highest output level for fringe signals is caused to be within a specified upper range by an automatic gain adjustment circuit.

In the preferred embodiment, as shown in FIG. 3, microprocessor 56 sets the DC offset voltage (step 8) applied to amplifier 50 such that the dark level output of A/D converter 58 is a magnitude of 12 out of 256 levels. This is around 5% of the A/D converter maximum range. This dark level of 12 corresponds to a 0.7 volt output of amplifier 50. An error-free dark level of 12 was chosen, as opposed to 0, so that microprocessor 56 can detect whether a dark signal applied to A/D converter 58 is too low.

Given that the output of the sample and hold circuit 46 ranges between 0 and 5 volts, the output of the unity gain amplifier 50 now ranges between 0.7 volts and –4.3 volts, since the sample and hold signal is inverted by amplifier 50. Accordingly, a dark photodiode 32 level shows up as 0.7 volts at the output of amplifier 50.

Accurately setting the DC offset enables an increased gain by the subsequent amplifier stage since errors are no longer amplified.

The next stage of the feedback system 10 provides an adjustable amplification gain of the output of amplifier 50 such that lower level signals are more amplified than higher level signals, but without exceeding a maximum level input into A/D converter 58. This amplification is performed by amplifier 60, connected to an output of amplifier 50, having an input impedance being effectively resistors R4 and R5 connected in parallel. Resistor R5 is a variable resistance as will be described below. A feedback impedance of amplifier 60 is either resistor R7 or the parallel combination of resistors R7 and R8. In the preferred embodiment, resistor R8 is one-fourth the value of resistor R7. Resistor R8 is switched into and out of the circuit by switch 64 which, in one embodiment, is an MOS transistor controlled by microprocessor 56.

Approximating the input impedance of amplifier 60 as an open circuit and the open loop gain of amplifier 60 as infinite, the gain of amplifier 60 is approximately $Z_F/Z_{in}$, where $Z_{in}$ is the parallel combination of resistors R4 and R5, and $Z_F$ is the parallel combination of R7 and R8 (assuming R8 is placed in parallel by switch 64). In the preferred embodiment, resistor R5 is controlled to provide seven different resistances or an open circuit, each causing the gain of amplifier 60 to be incremented or decremented by a gain of 0.4, and switch 64 is controlled to increase the gain by 5 times when in an open state. In the preferred embodiment, the gain of amplifier 60 is automatically controlled by microprocessor 56 to be between 1 and 19 in various increments as will be described with respect to FIGS. 4 and 5.

The value of resistor R5 and the controlling of switch 64 is performed by microprocessor 56 as follows. Microprocessor 56 continually monitors the digital output of the A/D converter 58. A/D converter 58 outputs a digital value for each photodiode 32 signal in the PDA 30. A pixel clock 66 controls A/D converter 58 to synchronize the conversion by A/D converter 58 with a sampling of the photodiode 32 signals. The same pixel clock 66 is also provided to microprocessor 56. This pixel clock 66 is generated by the PDA control circuit 34. A/D converter 58 outputs eight bits so as to provide a range of between 0 and 255 quantization levels. Microprocessor 56 monitors the output of A/D converter 58 to insure that a highest output level of amplifier 60 during scanning of PDA 30, for other than the center signal 22, is greater than 50% but less than 100% of the maximum output level (i.e., 255) of A/D converter 58 (step 9). This is illustrated in FIG. 3. Once the highest output level of A/D converter 58 for these fringe signals is between 50% and 100% of the A/D converter 58 maximum output level, no further adjustment is made to the gain of amplifier 60 (step 10). The range of 50% to 100% was chosen based upon the relatively coarse increments selected for the gain adjustment of amplifier 60 and based upon the realization that a highest output level of between 50% and 100% is sufficient for adequately measuring the characteristics of the fringe pattern 18. Other, more narrow, ranges may also be used.

This technique is an improvement over the gain being set manually using trimpots (i.e, potentiometers) since trimpots do not increase the dynamic range of the signal.

A voltage divider consisting of resistors R9 and R10 provides a DC offset voltage of 0.7 volts to the non-inverting terminal of amplifier 60 to offset the 0.7 volt dark level voltage output by amplifier 50. Hence, the output of amplifier 60 at node C continually forces the voltage at node B to be 0.7 volts. For a dark level input at node A, no current flows from node B and, therefore, node C will be at 0.7 volts. The gain of amplifier 60 does not affect this dark level voltage at node C.

Figure 4:
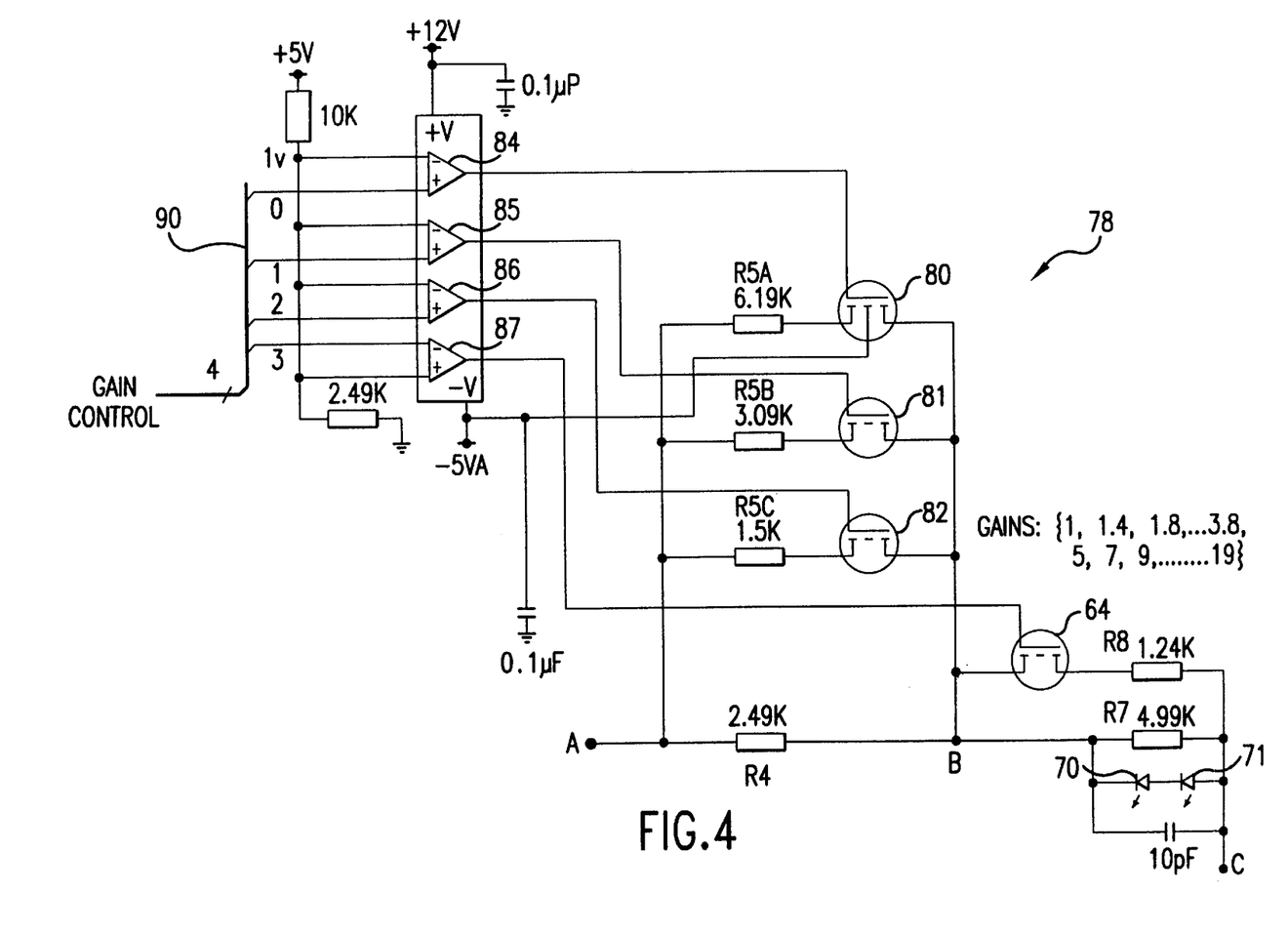
FIG. 4 provides additional detail of the automatic gain adjustment circuitry and the anti-saturation circuitry in the feedback circuit of FIG. 1.

The values of resistors R4, R7, R8, R9, R10 and the construction of resistor R5 is found in FIG. 4.

The output of amplifier 60 is then applied to the A/D converter 58 via resistor R11, which in the preferred embodiment is 49.9 ohms. The A/D converter 58 performs one conversion per photodiode 32 during a single scan of the PDA 30 so as to provide two million samples per second. If the automatic gain adjustment were not incorporated into the feedback system 10, the A/D converter 58 would have to be at least four bits larger to accommodate the full dynamic range of the PDA 30 output.

The particular A/D converter 58 used in the preferred embodiment has an input range of 0.6 to 2.6 volts, where 0.6 volts corresponds to a 0 digital output and 2.6 volts corresponds to a 255 digital output. A 0.7 volt input at node C corresponds to 5% of the input range, equal to a digital output of 12. Thus, the particular circuit described with respect to FIG. 1 converts the 0–5 volt range at the output of the sample and hold circuit 46 to the 0.6 to 2.6 volt range needed for A/D converter 58. The DC offset provided to amplifier 50 would be set accordingly based on the dark level input needed to cause the A/D converter 58 to output a specified value for a dark level.

A novel anti-saturation circuit will now be described. As seen by the simplified intensity level graph 20 in FIG. 1, the center signal 22 is much brighter than the surrounding fringe pattern 18. The peak of the center signal 22 is not used by any wavelength adjustment circuitry to adjust the wavelength of laser 12; only the relative position of the center signal 22 is used when determining wavelength. Thus, the detection of the peak of the center signal 22 is not required. The transistors in amplifier 60 saturate when the input voltage attempts to drive the output of amplifier 60 beyond the power supply voltage of 5 volts. If amplifier 60 were to saturate, the falling edge of the center signal 22 would be distorted. This distortion would appear as an undershoot, where the output of amplifier 60 would correspond to a signal darker than a true dark level signal. When setting a reference for the dark level, this undershoot may be misinterpreted as a dark level signal. It is thus desirable that amplifier 60 amplify the fringe signals (not including center signal 22) so that the highest output level of A/D converter 58 will be between 50% and 100% of its maximum output level of 255 without concern that the large magnitude center signal 22 will saturate amplifier 60.

Common techniques for preventing saturation of an operational amplifier include placing one or more zener diodes or other conventional diodes in series between the output of the amplifier and its inverting input so as to provide a predetermined voltage drop. Hence, when the output of the amplifier reaches a certain voltage level, any additional current gets fed back to the inverting input of the amplifier so as to clamp the output of the amplifier at a maximum level somewhere below the power supply voltage.

In the preferred system of FIG. 1, the feedback system 10 operates at a high rate (2 MHz), and the switching delays of conventional anti-saturation diodes prove to be a speed bottleneck. Applicant has discovered that using light emitting diodes (LED's) instead of conventional diodes in the anti-saturation circuit cause the anti-saturation circuit to have a faster reaction time and faster recovery time due to a lower capacitance (e.g., 20 pF) of the LED's. In the preferred embodiment, two LED's 70 and 71 are connected in series, with the anode of LED 71 connected to the output of amplifier 60 and the cathode of LED 70 connected to the inverting input of amplifier 60. The particular LED's 70 and 71 used output a red glow (aluminum/gallium/arsenide composition) and have a voltage drop of 1.6 volts per LED. The red-colored LED's, available from Hewlett-Packard Corporation, provide a specified low capacitance and convenient voltage drop. Depending upon the desired voltage drop, other types of LED's (e.g., green, yellow, blue) may also be used.

Without the anti-saturation circuit, amplifier 60 would saturate when its output attempts to exceed 4.5 volts. The LED's 70 and 71 now clamp the output of amplifier 60 to 3.2 volts above the 0.7 volt DC offset provided at the junction of resistors R9 and R10. Accordingly, the amplifier 60 does not saturate since its output is limited to a maximum of 3.9 volts.

More or fewer LED's may be connected in series depending upon the desired maximum output level of amplifier 60.

Accordingly, the center signal 22 may be clipped by the clamping performed by LED's 70 and 71, and this high analog signal may pin the output of A/D converter 58 to its maximum output level (shown in FIG. 3). This does not affect the operation of the automatic gain adjustment circuitry since the adjusted gain of amplifier 60 causes the fringe signals, and not the center signal 22, output by A/D converter 58 to have a highest level between 50% and 100% of the maximum output level of A/D converter 58. For an 8-bit A/D converter 58, the highest digital values for these fringe signals will be forced to be between 128 and 255.

In one type of laser 12, the amplitude of the fringe peaks may differ by 20% between pulses. This amplitude is not related to the wavelength, but related to the energy of the pulse. Thus, maintaining the gain of the fringe signals to produce an A/D converter 58 output between 50% and 100% of the maximum output level of A/D converter 58 does not generally require a change in the gain of amplifier 60 from pulse to pulse.

The relatively large amplification of the lower level photodiode 32 signals allows more precise measurement of the diameter and width of selected fringe rings to determine the wavelength of the laser 12 output and the spectral width of the laser light.

The A/D converter 58 output is applied to an input of microprocessor 56 for calculating the diameter of selected fringe rings (or other dimensions of the fringe rings), using an algorithm, to thus identify the wavelength of the laser beam. In one method, the position of the rising and falling edges of the center signal are used to obtain a relative position of the center signal with respect to the PDA 30. Using this relative position, the wavelength can be determined to an accuracy of, for example, 5 pm. Measuring the precise diameter of a fringe ring is then used to obtain a wavelength accuracy to within, for example, 0.01–0.03 pm. The position of a fringe signal may be obtained by calculating the positions of the rising and falling edges at one-half the peak magnitude and then calculating the midpoint. The distance between the rising and falling edges at one-half the peak magnitude is also used for calculating the spectral width of the laser light. One skilled in the art would understand the conversion of these characteristics into a wavelength and spectral width.

Microprocessor 56 then applies control signals to laser wavelength adjustment circuitry 76 for suitably adjusting the wavelength or other characteristic (e.g., spectral width) of laser 12 (step 11). Such laser wavelength adjustment circuitry 76 may be any type of adjustment circuitry used in the industry or described in any publication. In response to the wavelength detection signal or other control signal from microprocessor 56, laser 12 is adjusted by either mechanically adjusting the laser structure, such as by means of a stepper motor, or by adjusting certain optical components, or by adjusting a gas mixture in laser 12. Examples of various tuning methods and devices are described in the patents previously mentioned, incorporated herein by reference. Typically, the laser wavelength will be slewed up or down until microprocessor 56 detects the wavelength or other characteristic meets a desired criteria. Accordingly, microprocessor 56 may simply output an up or down control signal to adjustment circuitry 76.

Microprocessor 56 may also be programmed to determine the energy level of each pulse as well as the spectral width (based on the width of the fringe signals) of each pulse for use in characterizing the performance of the laser.

FIG. 4 illustrates in greater detail a variable resistor network 78 connected between nodes A and C in FIG. 1. The variable resistance in FIG. 4 adjusts both the input resistance and the feedback resistance to amplifier 60 to provide gains of 1, 1.4, 1.8, 2.2, 2.6, 3.0, 3.4, 3.8, and five times each of these gains.

Resistors R4 and R7 are fixed. The values of each of the resistors are identified in FIG. 4.

The effective resistance between nodes A and B is controlled by selectively coupling one or more of the resistors R5A, R5B, and R5C in parallel with resistor R4 via a switching transistor 80, 81, and 82. One can easily calculate the various equivalent resistances for the variable resistor R5 necessary to generate the desired gain of amplifier 60.

Transistor 64 is controlled to switch resistor R8 in parallel with resistor R7 to decrease the feedback resistance to one-fifth of the value of resistor R7. This attenuates the gain to one-fifth of the previous gain, assuming the states of the other switching transistors remain unchanged.

The various transistors in FIG. 4 are controlled by the outputs of differential amplifiers 84–87. Amplifiers 84–86 have an inverting input coupled to a 1 volt signal obtained from a divided 5 volt power supply source, and amplifier 87 has its noninverting terminal coupled to the 1 volt signal. A control signal of either 0 or 5 volts is applied to a respective non-inverting input terminal of amplifiers 84–86 and the inverting terminal of amplifier 87 to apply either a high logic level voltage or a low logic voltage to the control terminals of the various transistors. Bus 90 carries these four control signals from microprocessor 56 or another gain control source.

In one embodiment, the various resistors are switched to increase or decrease the gain incrementally between 1 and 19 in accordance with a 4-bit code until the peak fringe signals generate an output of A/D converter 58 between 50% and 100% of its maximum output level. Consequently, when the feedback system 10 is initially setting the gain, it will take a number of gain adjusting cycles before the gain is suitably adjusted.

Figure 5:
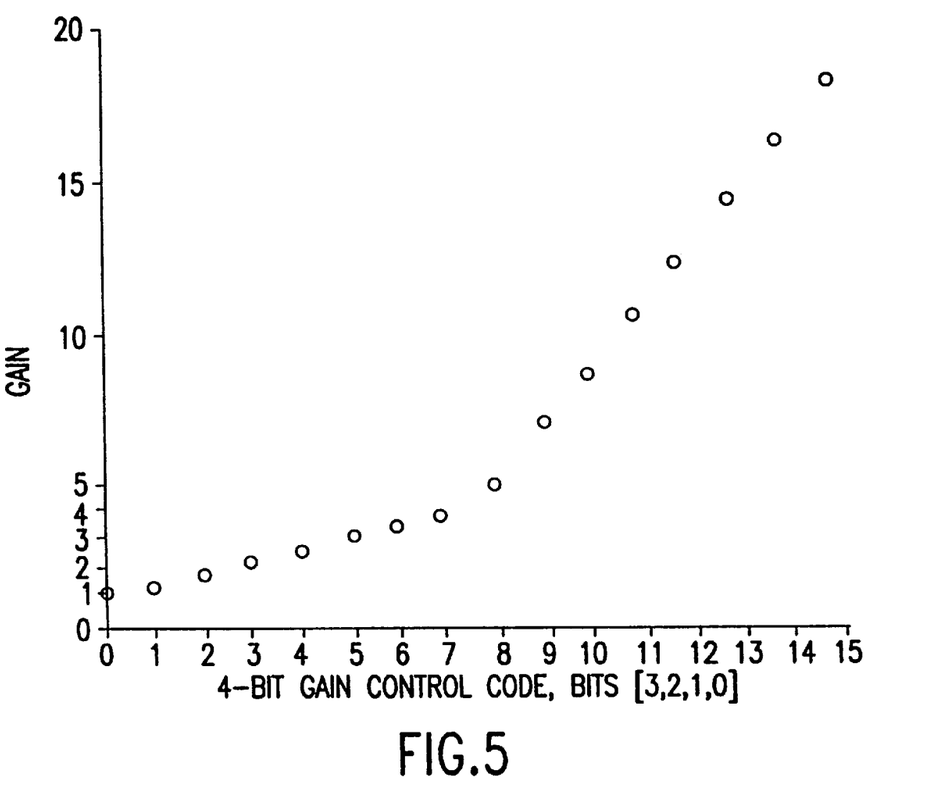
FIG. 5 is a graph of amplifier gain versus a 4-bit gain control signal.

The 4-bit code versus gain is shown in FIG. 5. The graph of FIG. 5 illustrates that amplifier 60 has a dual slope gain, with a 0.4X gain resolution between the binary control values 0 to 7 and a 2X gain resolution between the control values 8 to 15.

Other gains and other methods of controlling a variable resistance for the gain adjustment of amplifier 60 may also be used. The controller for controlling the switching of the various transistors in FIG. 4 may also be a state machine or other "hard-wired" logic circuit, acting as a processor.

Any variable gain amplifier may be used instead of the amplifier 60 and variable resistances.

Microprocessor 56 may be a single microprocessor, a hard-wired logic circuit, or a more complex system such as one or more personal computers.

Accordingly, a feedback system for controlling the wavelength of a tunable laser is described which provides automatic gain adjustment as well as an automatic DC offset in order to more accurately measure the fringe pattern for use in tuning a laser. The system also enables the use of a less expensive A/D converter and less expensive downstream processing circuitry. Additionally, a very fast anti-saturation clamp circuit has been described using LED's.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

what is claimed is:

1. A circuit within a feedback path of a detection circuit, said circuit comprising:
   a first amplifier having an input connected to receive an analog signal representing a light intensity;
   a detecting circuit, receiving a first signal corresponding to an output of said first amplifier, for detecting a second signal corresponding to a reference level of a light intensity;
   a converter for converting an output of said detecting circuit to an offset voltage; and
   a summing amplifier receiving said offset voltage and a signal corresponding to a light intensity level, an output of said summing amplifier outputting a predetermined level upon receiving said reference level of said light intensity, said offset voltage being used to achieve said predetermined level, an output of said summing amplifier being connected to an input of said first amplifier.

2. The circuit of claim 1 further comprising:
   an analog-to-digital converter connected to receive a signal corresponding to an output of said first amplifier;
   a processing circuit connected to an output of said analog-to-digital converter for generating a signal relating to a characteristic of light being monitored by said detection circuit.

3. The circuit of claim 2 further comprising laser wavelength adjustment circuitry connected to an output of said processing circuit for adjusting a light output characteristic of a tunable laser based upon values output from said analog-to-digital converter.

4. The circuit of claim 2 wherein said processing circuit detects a value of a digital output of said analog-to-digital converter and controls a gain of said first amplifier in response to said digital output to cause a peak output of said analog-to-digital converter to be within a predetermined range.

5. The circuit of claim 1 further comprising:
   a photodetector array for detecting a light pattern generated by a light source; and
   a sampling circuit connected to an output of said photodetector array for generating an analog signal associated with an output of one or more photodetectors in said array, said sampling circuit being connected to an input of said summing amplifier.

6. The circuit of claim 1 further comprising:
   a tunable laser;
   an interference generator for receiving at least a portion of light output from said laser and generating an interference pattern; and
   a photodetector circuit for sensing said interference pattern ad generating said analog signal representing said light intensity.

7. The circuit of claim 1 wherein said processing circuit adjusts a gain of said first amplifier to cause a peak output of said analog-to-converter to be above 50% of a maximum output level of said analog-to-digital converter for selected analog signals representing said light intensity.

8. The circuit of claim 1 further comprising a processor receiving a signal corresponding to an output of said summing amplifier and generating a signal corresponding to said offset signal.

9. The circuit of claim 8 further comprising a digital-to-analog converter for receiving a signal from said processor and generating an analog offset voltage for said summing amplifier.

10. The circuit of claim 9 wherein an output of said digital-to-analog converter is divided to create said offset voltage.

11. The circuit of claim 1 wherein said reference level is a dark level of said light intensity.

12. A method performed by a detection circuit comprising:

detecting an output of an analog-to-digital converter representing a light intensity;

detecting a digital signal corresponding to a reference level of said light intensity;

converting said signal corresponding to said reference level to an offset voltage; and summing said offset voltage and a signal corresponding to a light intensity level to generate an output having a predetermined level when said reference level of said light intensity is received by said summing amplifier, said output being amplified and connected to an input of said analog-to digital converter.

* * * * *